(12) United States Patent
Huang et al.

(10) Patent No.: US 8,338,243 B2
(45) Date of Patent: Dec. 25, 2012

(54) SEMICONDUCTOR DEVICE WITH RELIABLE HIGH-VOLTAGE GATE OXIDE AND METHOD OF MANUFACTURE THEREOF

(75) Inventors: Chyi-Chyuan Huang, Taipei (TW); Shyh-An Lin, Hsin-Chu (TW); Chen-Fu Hsu, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/103,807

(22) Filed: May 9, 2011

(65) Prior Publication Data

US 2011/0212585 A1    Sep. 1, 2011

Related U.S. Application Data

(63) Continuation of application No. 11/515,961, filed on Sep. 5, 2006, now Pat. No. 7,960,810.

(51) Int. Cl.
*H01L 21/336* (2006.01)

(52) U.S. Cl. .................. 438/190; 438/210; 438/238

(58) Field of Classification Search .................. 438/190, 438/210, 238
See application file for complete search history.

(56) References Cited

U.S. PATENT DOCUMENTS

| | | | |
|---|---|---|---|
| 4,449,224 A | 5/1984 | Harari | |
| 4,598,460 A | 7/1986 | Owens et al. | |
| 4,851,361 A | 7/1989 | Schumann et al. | |
| 5,331,181 A | 7/1994 | Tanaka et al. | |
| 5,338,701 A * | 8/1994 | Hsu et al. ...................... | 438/210 |
| 5,510,637 A | 4/1996 | Hsu et al. | |
| 5,591,658 A | 1/1997 | Cacharelis | |
| 6,124,160 A | 9/2000 | Segawa et al. | |
| 6,228,708 B1 | 5/2001 | Chang | |
| 6,274,411 B1 | 8/2001 | Patelmo et al. | |
| 6,407,435 B1 | 6/2002 | Ma et al. | |
| 6,407,442 B2 | 6/2002 | Inoue et al. | |
| 6,433,398 B1 | 8/2002 | Suzuki et al. | |
| 6,466,427 B1 | 10/2002 | Chen | |
| 6,853,052 B2 | 2/2005 | Ishikawa | |
| 7,011,999 B2 * | 3/2006 | Minami et al. ................. | 438/210 |
| 2004/0238898 A1 | 12/2004 | Ohgishi | |

FOREIGN PATENT DOCUMENTS

CN    1540769    10/2004

* cited by examiner

*Primary Examiner* — Eugene Lee

(74) *Attorney, Agent, or Firm* — Slater & Matsil, L.L.P.

(57) ABSTRACT

A semiconductor device including a capacitor and a proximate high-voltage gate having a boron-barrier layer that ideally serves as part of both the capacitor dielectric and the (high voltage) HV gate oxide. The boron-barrier layer is preferably formed over a poly oxide layer that is in turn deposited on a substrate infused to create a neighboring wells, and N-well over which the capacitor will be formed, and P-well to be overlaid by the HV gate. The boron-barrier helps to reduce or eliminate the harmful effects of boron diffusion from the P-well during TEOS deposition of the gate oxide material.

19 Claims, 4 Drawing Sheets

SEMICONDUCTOR DEVICE WITH RELIABLE HIGH-VOLTAGE GATE OXIDE AND METHOD OF MANUFACTURE THEREOF

This application is a continuation application of U.S. application Ser. No. 11/515,961, filed on Sep. 5, 2006, entitled "Semiconductor Device with Reliable High-Voltage Gate Oxide and Method of Manufacture Thereof," which application is hereby incorporated herein by reference.

TECHNICAL FIELD

The present invention relates generally to a semiconductor device and a method for fabricating such a device, and more particularly to a semiconductor device fabricated to ameliorate the undesirable effects of boron diffusion into the high-voltage gate oxide during the growth process, thereby raising the reliability of the high-voltage gate.

BACKGROUND

Small electronic devices are today used in a wide variety of applications and have become a ubiquitous part of modern society. These applications include computers, telephony, and home entertainment, among many others. One reason for the widespread use of these devices is that recent advances in technology have expanded their capabilities while at the same time lowering their cost. A key part of this advancing technology has been the development of semiconductor devices.

Semiconductors are materials that conduct electricity only under certain conditions, which often include the presence of a small electrical charge. This enables the manufacture of solid-state switches—those that have no moving parts. Other standard (and new) electrical devices can be created out of semiconductors as well. In addition to having no moving component parts that are subject to fatigue or other mechanical failure, solid state devices can be fabricated in extremely small sizes. Very small, even microscopic electrical components are now used to provide the multitude of switches and capacitors necessary for today's electronics applications.

The processes used to fabricate these tiny semiconductor devices are numerous, but the basic process may be described generally. A material, such as silicon, is produced for use as a base, or substrate, upon which various electrical components will be built. This material is then formed into an appropriate shape, usually a thin slice called a wafer. The pure silicon is then selectively treated with one or more materials called dopants, such as ionized boron or phosphorus. The introduction of these impurities begins the process of creating the desired semiconductive properties. Various structures may then be formed at or near one surface of the wafer to construct the desired components.

These surface structures may be formed by etching, whereby the surface is exposed to an etching agent. Or, more typically, the surface is selectively etched using a process known as photolithography. In photolithography, a material called photoresist, or simply resist, is deposited evenly over the wafer surface. The resist is then selectively treated with a light source directed though a patterned mask so that some portions of the resist are exposed to the light energy while others are not. The exposed portions are developed to be either strengthened or weakened, depending on the type of resist material used, so that the weaker portions can be washed away using a solvent that will not otherwise affect the wafer or any structures already formed on it. The resist that remains however, will prevent the etching of the wafer surface in the areas it covers when a stronger etching agent is used in subsequent etching steps. When the desired wafer etching has been accomplished, the remaining photoresist is removed using an appropriate solvent.

Materials such as metals, other conductors, and insulators are added to the wafer surface using any of a variety of deposition methods, for example, chemical vapor deposition (CVD) or sputtering. Additional ion implantation may also be performed. By selectively adding and removing these various materials, layer after layer of electrical components can be formed on the wafer surface (or on top of previously formed structures).

A single wafer is usually populated with a number of dice, or portions of the wafer that will eventually be used separately. Frequently, all of the dice on a single wafer are formed identically, but this is not necessarily the case. After the fabrication is complete (and often at various intermediate steps as well), the wafer is inspected so that defective regions can be marked for discard or repair. The dice are eventually separated and those passing inspection are packaged, that is encapsulated in a hard plastic material and provided with external leads connected to various internal locations. The encapsulated die that has been provided with a number of leads is often referred to as a chip.

During the fabrication process itself, groups of the electrical components on the wafer may be formed at more or less the same time. That is, whenever a certain material is deposited or selectively etched away, the material may be used for a variety of devices—even if they are not the same kind of component. Naturally this requires careful planning, but has the advantage of economy where it can be done successfully.

For example, in a high voltage mixed mode (HV-M.M) application, a semiconductor device having a capacitor structure disposed between an NMOS low-voltage (LV) gate and an NMOS high-voltage (HV) gate may be formed in this fashion, as illustrated in FIGS. 1A through 1F. FIGS. 1A through 1F are cross-sectional representations illustrating a semiconductor device 10 at various stages of a conventional fabrication process. Note that as used herein the term "semiconductor device" will sometimes be used to refer to one or more dice for use in chips as described above, and at other times to a discreet portion of such a die that is being described to illustrate a particular device or process.

The semiconductor device 10 illustrated in FIGS. 1A through 1F is fabricated beginning with a substrate 12, which has been selectively doped to create three separate regions. These regions, illustrated in FIG. 1A, are P-well 15, N-well 20, and P-well 25. These three regions are created in this way to support the three devices mentioned above (shown as formed in FIG. 1F). In accord with the definition provided above, the semiconductor device of FIG. 1 encompasses these three components and their related structures. The process continues with the formation of the field oxide structures 30, 31, 32, and 33. At the same time (or subsequently) an HV gate oxide 35 is formed over P-well 15 as illustrated by FIG. 1B. This may be done, for example, by using a TEOS (tetraethyl orthosilicate) chemical vapor deposition (CVD) process followed by selective wet etching. The process of etching away portions of a deposited layer produces a desirable pattern and is sometimes referred to as 'patterning'.

A second gate oxide layer 40 is then formed, this time over the entire exposed surface of the semiconductor device, as shown in FIG. 1C. A conductive layer, for example of poly-silicon, is then formed and selectively etched away to form the conductive structures 45, 46, and 47 shown in FIG. 1D. Structure 46 forms the bottom conductive layer of a capacitor, and structure 45 is a HV gate electrode and structure 47 is a LV gate electrode. For the capacitor, an interpoly oxide/high-temperature oxide 50 is then formed over conductive structure 46, as shown in FIG. 1E. Finally, a second conductive layer 55 is deposited and formed over interpoly oxide/high-temperature oxide layer 50 to form the top conductor of the capacitor. The configuration of the semiconductor device 10 at this stage is illustrated in FIG. 1F.

This conventional method has the disadvantage of frequently producing less than satisfactory HV gate oxide reliability. This is apparently due at least in part to boron diffusion from P-well 15 during the TEOS process, resulting in a relatively weaker gate oxide. Needed then is a process to create a semiconductor device substantially equivalent to the one illustrated in FIGS. 1A through 1F, but with higher HV gate reliability. The present invention provides just such a solution.

SUMMARY OF THE INVENTION

These and other problems are generally solved or circumvented, and technical advantages are generally achieved, by preferred embodiments of the present invention, which are directed to a semiconductor device having a capacitor and a high voltage (HV) gate, where the integrity and the reliability of the HV gate oxide is enhanced by deposition of an ion-barrier layer prior to formation of the gate oxide.

In one aspect, the present invention is a semiconductor device that in a preferred embodiment includes a capacitor disposed between a HV gate and a low voltage (LV) gate, the capacitor forming a first conductive layer and a second conductive layer, the conductive layers being formed, for example of a polysilicon material that is deposited or grown and then patterned into the appropriate structures to form the capacitor plates. The plates, in this embodiment, are separated by a dielectric composed, for example, of a poly oxide layer and a silicon nitride layer, the silicon nitride layer perhaps being formed as a film. In one embodiment, an ion-barrier film is formed on the substrate (or on a poly oxide layer formed on the substrate) to prevent ion-diffusion based degradation of the gate oxide layer when it is grown or deposited prior to formation of and overlying gate electrode. Generally, the advantages of the present invention obtain when the HV gate is formed over a P-well because boron diffusion is a greater concern than, for example, phosphorus diffusion. In one embodiment, the ion-barrier layer is a silicon nitride ($Si_3N_4$) film. In other embodiments, it may be formed of one or more of the group tantalum oxide nitride ($Ta_xO_yN_z$), zirconium oxide nitride ($Z_rO_yN_z$), zinc oxide nitride ($Z_nO_yN_z$), silicon carbide ($Si_xC_y$), and silicon oxide nitride ($Si_xO_yN_z$), where x is any positive integer and y and z are any non-negative integer. Ideally, film forming a portion of the capacitor dielectric and the ion-barrier stop layer are deposited in the same process step.

In another aspect, the present invention is a method of fabricating a semiconductor device. In a preferred embodiment, the method includes the steps of providing a substrate such as crystalline silicon wafer and creating, in the substrate, a plurality of wells including at least a P-well and adjacent N-well, forming a first oxide layer over the plurality of wells, and forming a first conductive structure over the oxide layer above the N-well. In this embodiment, a poly oxide layer is then formed over the entire device, and a silicon nitride layer is formed over the poly oxide layer. The silicon nitride layer is preferably deposited as a film. In this embodiment, the silicon nitride layer forms a portion of the dielectric for the capacitor. A gate oxide is then formed over the P-well, with the silicon nitride layer acting as a boron stop layer to prevent excess boron diffusion from degrading the gate oxide material. The gate oxide may be deposited using TEOS process. A final conductive layer is deposited and patterned to produce, in the preferred embodiment, the top capacitor plate and the HV gate electrode.

In another aspect, a method comprising forming a first capacitor plate over a first region of a substrate and forming a boron-barrier layer over the first capacitor plate and over a second region of the substrate is provided. A high-voltage gate electrode is formed over the boron-barrier layer in the second region and a second capacitor plate is formed over the boron-barrier layer.

In yet another aspect, a method comprising forming a first gate stack over a first region of a substrate, the substrate also comprising a second region and forming a boron-barrier layer over the first region and the second region, the forming the boron-barrier layer being performed after the forming the first gate stack is provided. A high-voltage transistor is formed in the second region, wherein the forming the high-voltage transistor further comprises forming a source region and a drain region and forming a single high-voltage gate electrode between the source region and the drain region, the forming the single high-voltage gate electrode being performed after the forming the boron-barrier layer.

In yet another aspect, a method comprising forming a boron-barrier layer over a bottom capacitor plate, the bottom capacitor plate being located in a first region of a substrate, the boron-barrier layer extending into a second region of the substrate is provided. A first layer of conductive material is formed over the boron-barrier layer in both the first region and the second region and the first layer of conductive material is patterned to form a top capacitor plate over the bottom capacitor plate and to form a high-voltage gate electrode in the second region.

As more complete appreciation of the present invention and the scope thereof can be obtained from the accompanying drawings that are briefly summarized below, the following detailed description of the presently preferred embodiments of the present invention, and the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely, the fabrication of a semiconductor device fabricated according to HV-M.M technology. The semiconductor device described below includes a capacitor disposed between a high voltage (HV) gate and a low voltage (LV gate). The invention may also be applied, however, to other semiconductor devices as well. The embodiment of the present invention described below is directed to the manufacture of a semiconductor device in such a manner so as to mitigate the undesirable effects of boron diffusion to a HV oxide area formed over a P-well. (Phosphorus-diffusion degradation in layers formed over N-wells is not considered a comparable problem). This embodiment is described with reference to FIGS. 2A through 2F.

Figure 1A:
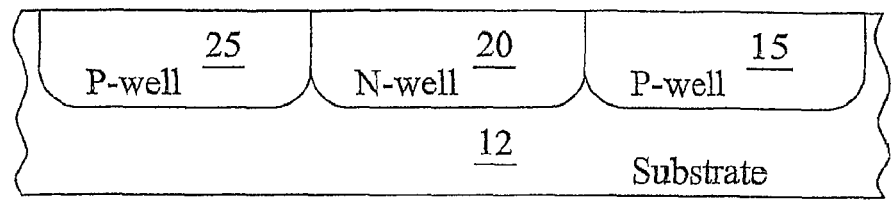
FIGS. 1A through 1F are cross-sectional representations illustrating a semiconductor device at various stages of fabrication according to a process of the prior art.
Figure 1B:
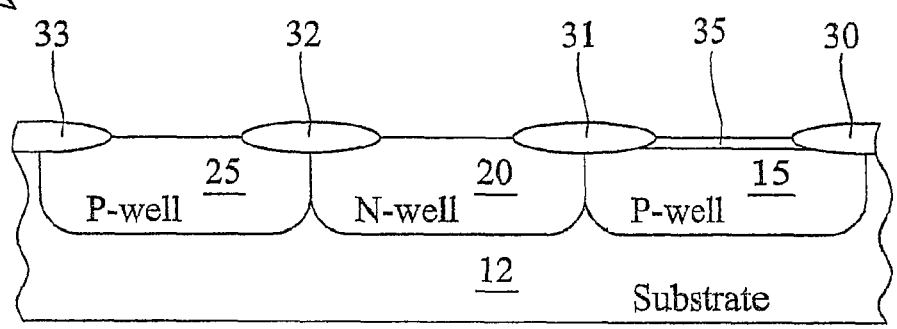
Figure 1C:
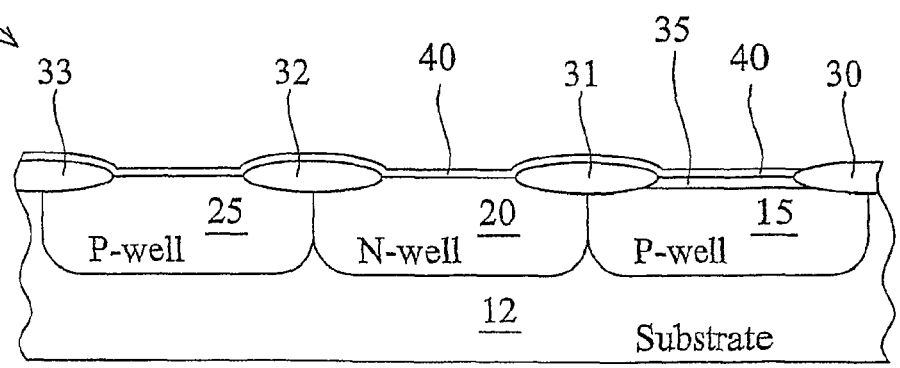
Figure 1D:
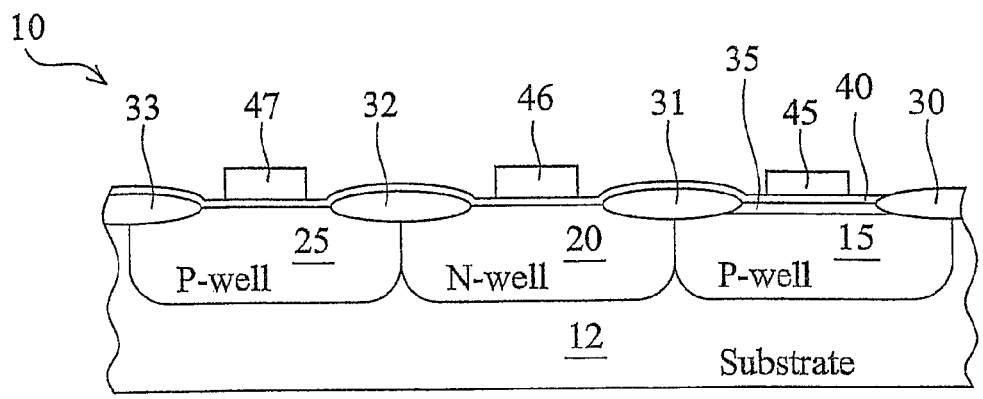
Figure 1E:
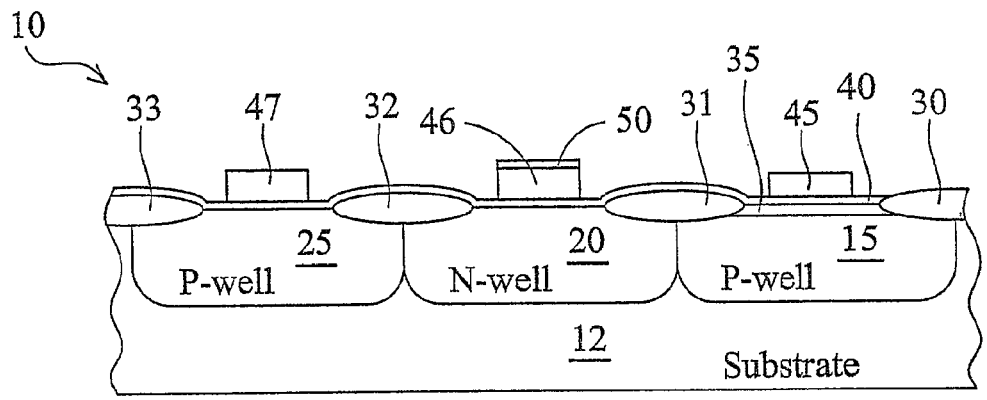
Figure 1F:
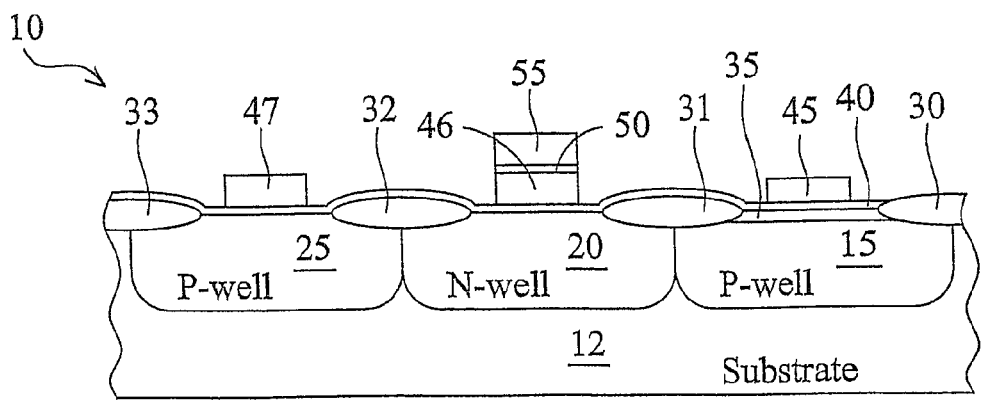
Figure 2A:
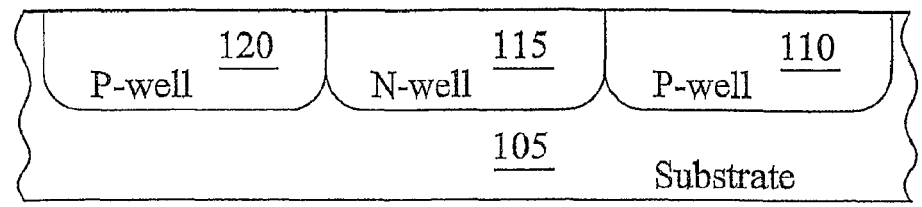
FIGS. 2A through 2F are cross-sectional representations illustrating a semiconductor device at various stages of fabrication according to an embodiment of the present invention.
Figure 2B:
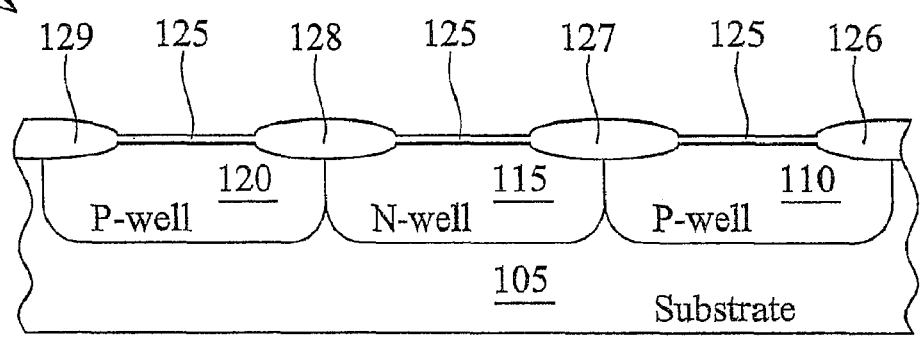

FIGS. 2A through 2F are cross-sectional representations illustrating a semiconductor device 100 at various stages of fabrication according to an embodiment of the present invention. This embodiment is direct to a device similar to the device of FIGS. 1A through 1F in that it includes a capacitor structure and an HV gate. As with the process of the prior art described above, the process of the present invention begins with the formation of three wells in a substrate material. In this embodiment of the present invention, N-well 115 is formed in substrate 105 between P-well 110 and P-well 120. This initial stage of fabrication is illustrated in FIG. 2A. A thin gate oxide layer 125 and field oxide structures 126, 127, 128, and 129 are then formed as well, resulting in the configuration depicted in FIG. 2B. Note that the relative sizes of these structures may vary from those depicted in the drawings.

Figure 2C:
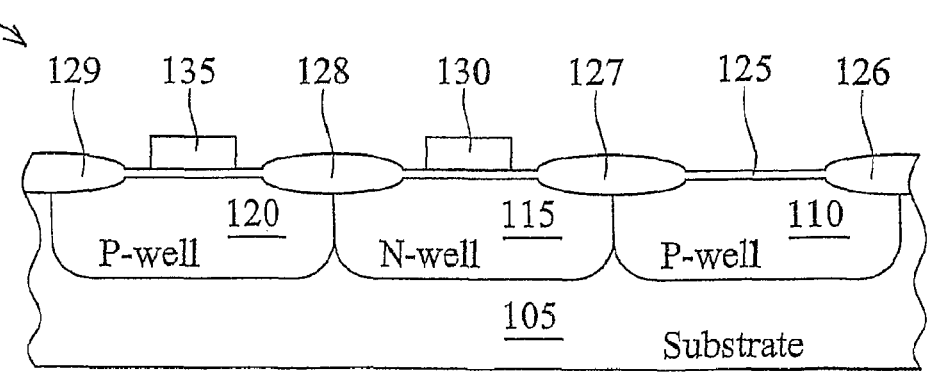
Figure 2D:
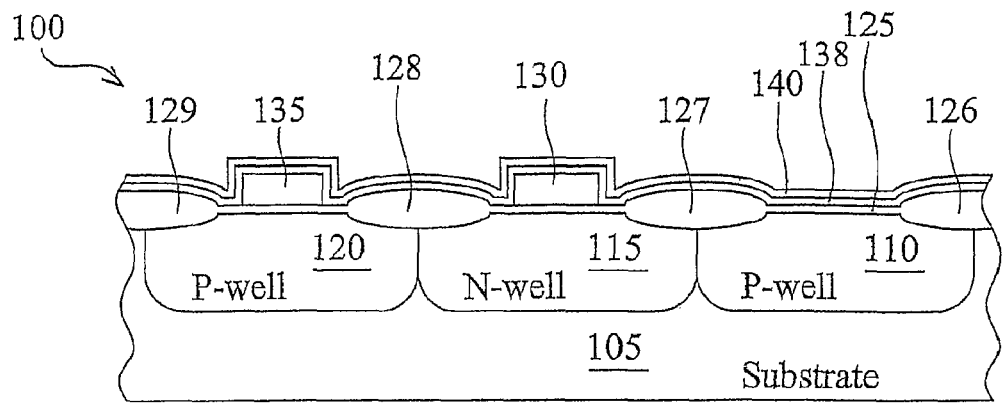
Figure 2E:
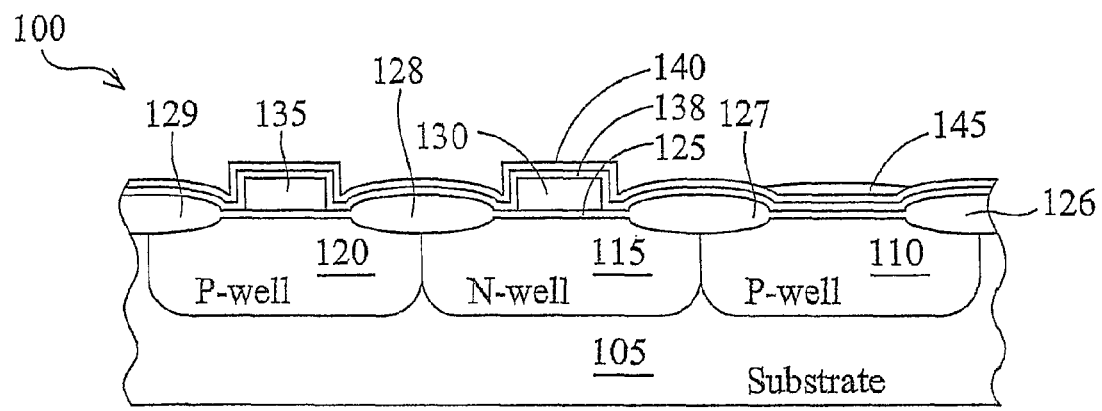

In accordance with this embodiment of the present invention, a first polysilicon layer is then formed and patterned, using a process such as photolithography, resulting in the poly structures 130 and 135 shown in FIG. 2C. Note that no such structure is formed over P-well 110 at this stage. Instead, a poly oxide layer 138 is formed, for example deposited or grown over the entire structure. A layer, and preferably a thin film of silicon nitride ($Si_3N_4$) 140 is deposited, also over the entire structure. Other materials may be used as well, for example tantalum oxide nitride ($Ta_xO_yN_z$), zirconium oxide nitride ($Z_rO_yN_z$), zinc oxide nitride ($Z_nO_yN_z$), silicon carbide ($Si_xC_y$), and silicon oxide nitride ($Si_xO_yNz$), where x is any positive integer and y and z are any non-negative integer. The configuration of semiconductor device 100 at this stage is illustrated in FIG. 2D.

Figure 2F:
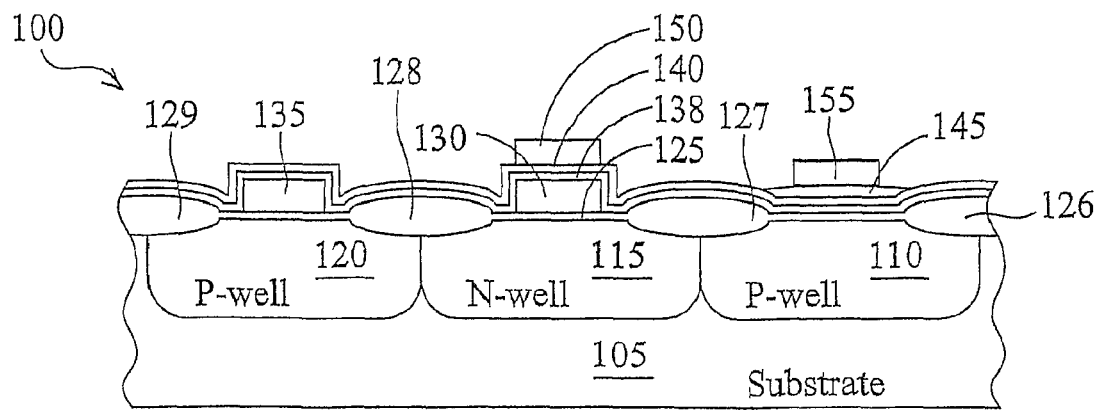

It has been discovered that the $Si_3N_4$ layer 140 functions satisfactorily as the dielectric material between the conductive elements of the capacitor structure 160 (see FIG. 2F). More significantly, in this embodiment the $Si_3N_4$ layer 140 serves as a boron stop layer to prevent, or at least to retard boron diffusion from the P-well 110 during deposition of the HV gate oxide. In this embodiment, a gate oxide material is deposited by a TEOS deposition technique, and patterned by a wet dip etching to form the gate oxide structure 145 shown in FIG. 2E.

The fabrication of semiconductor device 100 according to the embodiment of FIGS. 2A through 2F is then completed with the deposition of a second polysilicon layer, which is then patterned to form structure 150 of capacitor 160. The resulting configuration is illustrated in FIG. 2F. There, it may be seen that structure 150, which forms the top conductive element of capacitor 160, has been formed over the $Si_3N_4$ layer 140, and also that gate electrode 155 has been formed over the gate oxide 145. As mentioned above, greater gate reliability is expected due to the use of $Si_3N_4$ (or other ion-barrier) layer 140 to protect the gate oxide 145 from boron diffusion. Where the ion-barrier layer is formed so as to prevent or retard boron diffusion from the p-well, it may be more specifically referred to as a "boron-barrier layer".

A method for fabricating a semiconductor device is also in accordance with an embodiment of the present invention. In one embodiment, the method includes the steps of providing a first well disposed between a second well and a third well, forming a first oxide layer over the first, second, and third wells, forming a first conductive structure on the oxide layer over the first well and a second conductive structure on the oxide layer over the second well. The method according to this embodiment continues with the oxide layer over the second well. The method according to this embodiment continues with depositing a silicon nitride ($Si_3N_4$) ion-barrier layer over the first, second, and third wells, wherein the $Si_3N_4$ layer is formed over the first conductive structure and over the second conductive structure, forming a second oxide layer, forming a third conductive structure over the first well, wherein the first conductive structure having the $Si_3N_4$ layer and the second oxide layer as a dielectric, and finally forming a fourth conductive structure over the third well. The fourth conductive structure may, for example, form a gate electrode for a high-voltage gate. In one embodiment, the embodiment, the third well is a P-well.

Instead of $Si_3N_4$, in other embodiments the ion-barrier layer may also comprise one or more of tantalum oxide nitride ($Ta_xO_yN_z$), zirconium oxide nitride ($Z_rO_yN_z$), zinc oxide nitride ($Z_nO_yN_z$), silicon carbide ($Si_xC_y$), and silicon oxide nitride ($Si_xO_yNz$), where x is any positive integer and y and z are any non-negative integer.

The method of this embodiment may also include the step of forming a polyoxide layer, for example by an epitaxial-growth process, prior to depositing the $Si_3N_4$ layer. In various embodiments, the second oxide layer described above may be formed using TEOS deposition. The third conductive structure and the fourth conductive structure are deposited in the same process step and may be formed, for example, of polysilicon.

In another embodiment, the present invention is a method of forming a semiconductor device including the steps of providing a substrate, creating a P-well in the substrate, depositing a silicon nitride layer over the P-well, forming an oxide layer on the silicon nitride (or other ion-barrier) layer over the P-well, for example by TEOS deposition, and forming a conductive structure on the oxide layer. The conductive structure may be, for example, a gate electrode for a high-voltage gate, and may be made of polysilicon. The method may also include forming a capacitor proximate to the gate electrode. Forming the capacitor may include the steps of forming a first plate, forming a dielectric layer comprising silicon nitride over the first plate, and forming a second plate over the dielectric layer. The gate electrode and the second plate may be formed of the same material and be formed of a single patterned layer, which may comprise polysilicon.

In one embodiment, the step of forming a silicon nitride dielectric layer is performed at the same time as the step of depositing the silicon nitride layer over the P-well. The method may also include forming a dielectric layer comprising a polyoxide over the first plate, wherein the polyoxide formation is performed prior to the silicon nitride deposition.

Although the present invention and its advantages have been described in detail, it should be understood that various changes, substitutions and alterations can be made herein without departing from the spirit and scope of the invention as defined by the appended claims. For example, the steps of the sequence described above may be done in any logically permissible order and steps may be added without deviating from the spirit of the invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or step.

What is claimed is:

1. A method comprising:
forming a first capacitor plate over a first region of a substrate;
forming a low-voltage gate electrode over a second region of the substrate;
forming a boron-barrier layer over the first capacitor plate, over the low-voltage gate electrode, and over a third region of the substrate;
forming a high-voltage gate electrode over the boron-barrier layer in the third region; and
forming a second capacitor plate over the boron-barrier layer.

2. The method of claim 1, wherein the forming the boron-barrier layer further comprises forming a layer of silicon nitride.

3. The method of claim 1, wherein the forming the boron-barrier layer further comprises forming a material comprising at least one of tantalum oxide nitride ($Ta_xO_yN_z$), zirconium oxide nitride ($ZrO_yN_z$), zinc oxide nitride ($ZnO_yN_z$), silicon carbide ($Si_xC_y$), and silicon oxide nitride ($Si_xO_yN_z$), where x is any positive integer and y and z are any non-negative integer.

4. The method of claim 1, further comprising:
forming a first oxide layer over the third region of the substrate prior to the forming the boron-barrier layer; and
forming a second oxide layer over the boron-barrier layer prior to the forming the high-voltage gate electrode.

5. The method of claim 1, further comprising forming a first conductive layer over the boron-barrier layer, wherein the high-voltage gate electrode and the second capacitor plate are both formed from the first conductive layer.

6. The method of claim 1, wherein the forming the low-voltage gate electrode is performed at the same time as the forming the first capacitor plate.

7. A method comprising:
forming a first gate stack over a first region of a substrate, the substrate also comprising a second region;
forming a boron-barrier layer over the first region and the second region, the forming the boron-barrier layer being performed after the forming the first gate stack; and
forming a high-voltage transistor in the second region, wherein the forming the high-voltage transistor further comprises:
forming a source region and a drain region; and
forming a single high-voltage gate electrode between the source region and the drain region, the forming the single high-voltage gate electrode being performed after the forming the boron-barrier layer.

8. The method of claim 7, further comprising forming a bottom capacitor plate in a third region of the substrate, the forming the bottom capacitor plate being performed at least in part simultaneously with the forming the first gate stack.

9. The method of claim 8, further comprising forming a top capacitor plate over the boron-barrier layer, the forming the top capacitor plate being performed at least in part simultaneously with the forming the single high-voltage gate electrode.

10. The method of claim 7, further comprising forming a first oxide layer over the first gate stack and over the second region prior to the forming the boron-barrier layer.

11. The method of claim 10, further comprising forming a second oxide layer over the boron-barrier layer in the second region, the forming the second oxide layer being performed prior to the forming the single high-voltage gate electrode.

12. The method of claim 7, wherein the forming the boron-barrier layer further comprises forming a layer of silicon nitride.

13. The method of claim 7, wherein the forming the boron-barrier layer further comprises forming a material comprising at least one of tantalum oxide nitride ($Ta_xO_yN_z$), zirconium oxide nitride ($ZrO_yN_z$), zinc oxide nitride ($ZnO_yN_z$), silicon carbide ($Si_xC_y$), and silicon oxide nitride ($Si_xO_yN_z$), where x is any positive integer and y and z are any non-negative integer.

14. A method of manufacturing a semiconductor device, the method comprising:
forming a capacitor bottom plate over a first region of a substrate;
forming a first gate stack over a second region of the substrate;
forming a boron-barrier layer over the first region of the substrate and the second region of the substrate after the forming the first gate stack;
forming a capacitor top plate over the boron-barrier layer in the first region of the substrate; and
forming a second gate stack over the boron-barrier layer in a third region of the substrate, wherein the second gate stack is a high-voltage gate stack.

15. The method of claim 14, wherein the boron-barrier layer is silicon nitride.

16. The method of claim 14, wherein the forming the capacitor bottom plate and the forming the first gate stack are performed at least in part simultaneously.

17. The method of claim 14, wherein the forming the capacitor top plate and the forming the second gate stack are performed at least in part simultaneously.

18. The method of claim 14, further comprising forming a first oxide layer over the first gate stack prior to the forming the boron-barrier layer.

19. The method of claim 18, further comprising forming a second oxide layer over the boron-barrier layer, the forming the second oxide layer being performed prior to the forming the second gate stack.

* * * * *